(12) United States Patent
Gektin et al.

(10) Patent No.: US 8,097,813 B2
(45) Date of Patent: Jan. 17, 2012

(54) CARBON NANOTUBE BASED INTERPOSER

(75) Inventors: Vadim Gektin, San Jose, CA (US);
David W. Copeland, Mountain View, CA (US)

(73) Assignee: Oracle America, Inc., Redwood City, CA (US)

(*) Notice: Subject to any disclaimer, the term of this patent is extended or adjusted under 35 U.S.C. 154(b) by 374 days.

(21) Appl. No.: 12/414,122

(22) Filed: Mar. 30, 2009

(65) Prior Publication Data

US 2010/0243298 A1 Sep. 30, 2010

(51) Int. Cl.
*H05K 1/03* (2006.01)
(52) U.S. Cl. ...................................................... 174/255
(58) Field of Classification Search ................ 174/255, 174/260–266; 361/792–795
See application file for complete search history.

(56) References Cited

U.S. PATENT DOCUMENTS 7,453,154 B2 * 11/2008 Teo et al. ...................... 257/777

OTHER PUBLICATIONS http://www.lgasockets.com/desc/default.htm, Land Grid Array Socket System, cLGA Product Description, LGASockets.com : Product Description—InterCon Systems, printed Feb. 10, 2009, 2 pages.
http://www.cinch.com/view_sub_product_line.cinch, Cinch Connectors :: Z-axis Compression, Cinch Connect Your World, Cinch iQ, printed Feb. 10, 2009.
http://catalog.tycoelectronics.com/catalog/bin/TE.Connect, 1-1746664-3 Product Details—Tyco Electronics, printed Feb. 10, 2009, 1 page.
http://catalog.tycoelectronics.com/catalog/feat/en/c/23657, LGA Sockets Product Feature Selector—Tyco Electronics, printed Mar. 30, 2009, 3 pages.

* cited by examiner

*Primary Examiner* — Javaid Nasri
(74) *Attorney, Agent, or Firm* — Brooks Kushman P.C.

(57) ABSTRACT

In at least one embodiment, an interposer for a board interconnect system is provided. The interposer comprises a frame and at least one interconnect. The frame receives a substrate. The substrate includes a top side, a bottom side, and a conductive interface. The conductive interface extends through the top side and the bottom side for delivering an electrical signal from an electrical device positioned on the top side therethrough. The at least one interconnect includes a plurality of carbon nanotubes (CNTs) positioned within the frame for contacting the conductive interface of the substrate to deliver the electrical signal to a conductive arrangement of a circuit board.

16 Claims, 4 Drawing Sheets

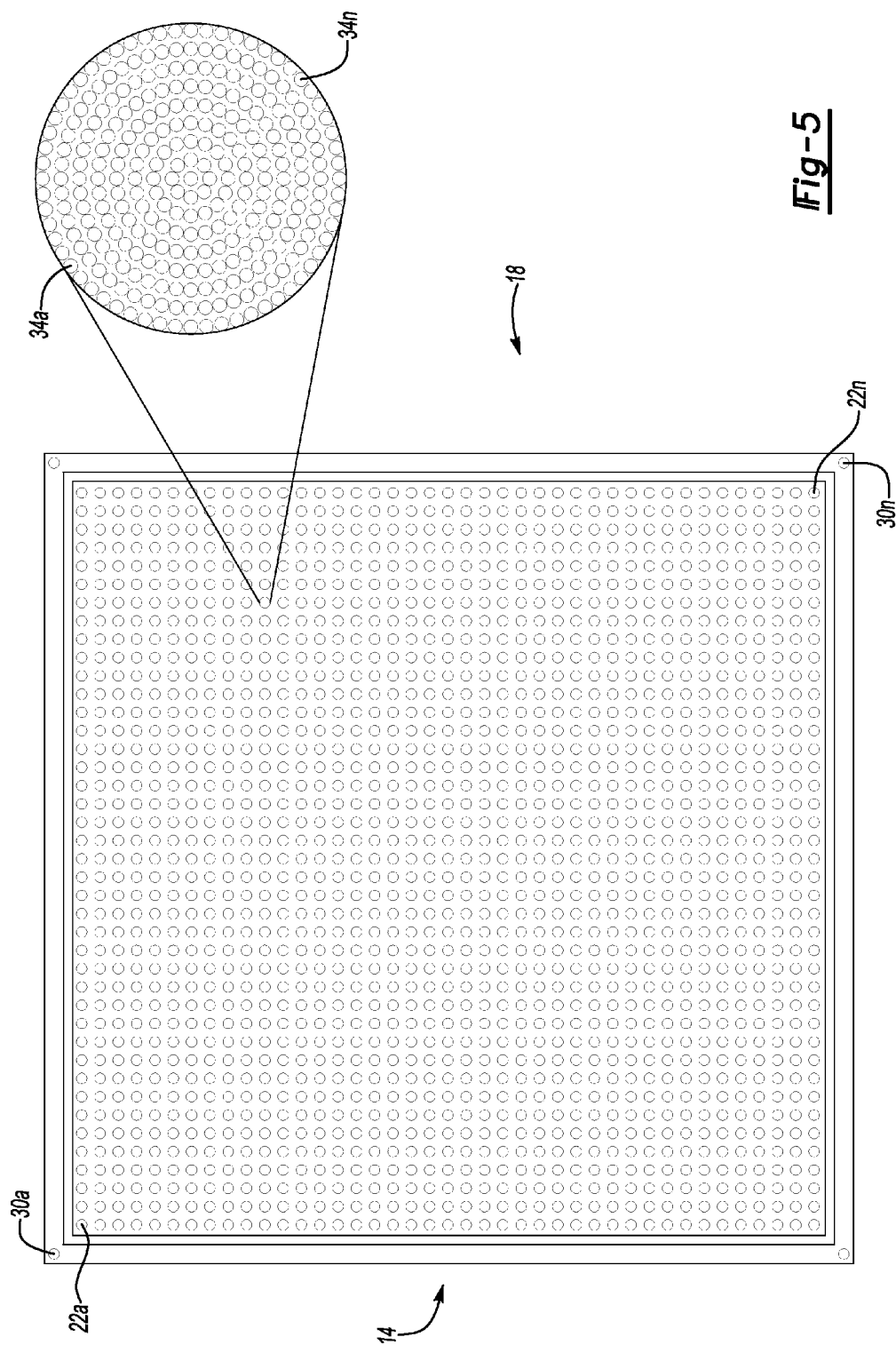

CARBON NANOTUBE BASED INTERPOSER

BACKGROUND OF THE INVENTION

1. Field of the Invention

One or more embodiments of the present invention generally relate to a carbon nanotube based interposer for use in device related to board interconnect technologies.

2. Background Art

An interposer (or socket) is generally defined as an interface that is sandwiched between an electrical device, a substrate, and conductive material (or pads) on a printed circuit board (PCB). The electrical device is a die or silicon. The electrical device may be, but not limited to, an integrated circuit (IC) packaged in the form of a surface mount device (SMD). The electrical device is supported by the substrate. The substrate interfaces with the electrical device to spread the electrical connection of the electrical device to a wider pitch. The interposer generally includes a support structure that is positioned below the substrate. The support structure is supported by the PCB. The substrate and the support structure each generally include electrically conductive interconnects positioned therein. The electrical device transfers electrical signals to the PCB via interconnects within the substrate and the support structure.

In general, the electrical interface between the substrate and the support structure may include solder balls/columns or direct attach pins. Such an electrical interface that comprises solder balls/columns or direct attach pins are generally limited to smaller interposer packages. Above a certain size threshold (e.g., such thresholds may vary based on different substrate and PCB materials), larger interposers may be needed. Functionality and reliability of the larger size interposers may not be achievable due to dissimilar properties between the substrate/electrical device (or package) and the PCB. Such dissimilar properties may result in different expansions at operating conditions as well as shape changes (i.e., flexing) that may lead to failure.

For high power electrical devices, power delivery is limited by heating and voltage drops across the conductive interconnects in the interposer. In many cases, to enable power delivery for high power devices, a large number of interconnects are needed. Such an increase in the number of interconnects leads to a larger package and may further complicate the thermally-driven mechanical mismatch problem noted above.

SUMMARY OF THE INVENTION

In at least one embodiment, an interposer for a board interconnect system is provided. The interposer comprises a frame and at least one interconnect. The frame receives a substrate. The substrate includes a top side, a bottom side, and a conductive interface. The conductive interface extends through the top side and the bottom side for delivering an electrical signal from an electrical device positioned on the top side therethrough. The at least one interconnect includes a plurality of carbon nanotubes (CNTs) positioned within the frame for contacting the conductive interface of the substrate to deliver the electrical signal to a conductive arrangement of a circuit board.

In yet another embodiment, a board interconnect system comprising an electrical device, a circuit board, a substrate, and an interposer is provided. The electrical device transmits an electrical signal. The circuit board receives the electrical signal. The substrate includes a top side, a bottom side, and a conductive interface. The conductive interface extends through the top side and the bottom side for delivering the electrical signal from the electrical device to the circuit board. The interposer includes a frame and at least one interconnect. The frame receives the substrate. The at least one interconnect includes a plurality of carbon nanotubes (CNTs) positioned within the frame for contacting the conductive interface of the substrate to deliver the electrical signal to a conductive arrangement of the circuit board.

In yet another embodiment, a board interconnect system comprising an electrical device, a circuit board, a substrate, and an interposer is provided. The electrical device transmits an electrical signal. The circuit board includes a conductive arrangement for receiving the electrical signal. The substrate includes a top side, a bottom side, and a conductive interface. The conductive interface extends through the top side and the bottom side for delivering the electrical signal from the electrical device positioned on the top side therethrough. The interposer includes at least one interconnect having a first plurality of carbon nanotubes (CNTs) in electrical communication with the conductive interface of the substrate to deliver the electrical signal to the conductive arrangement of the circuit board.

BRIEF DESCRIPTION OF THE DRAWINGS

The embodiments of the present invention are pointed out with particularity in the appended claims. However, other features of the various embodiments will become more apparent and will be best understood by referring to the following detailed description in conjunction with the accompany drawings in which:

FIG. 5 depicts a bottom view of the interposer in accordance to one embodiment of the present invention.

DETAILED DESCRIPTION

Detailed embodiments of the present invention are disclosed herein. However, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the one or more embodiments of the present invention.

Figure 1:
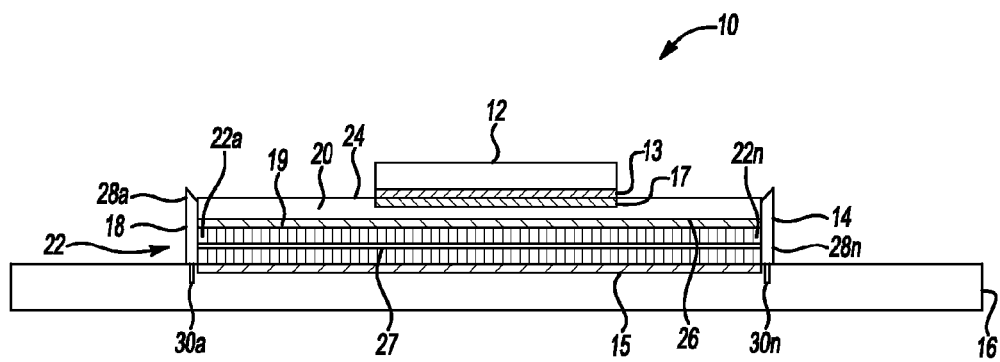
FIG. 1 depicts a board interconnect system in accordance to one embodiment of the present invention.

FIG. 1 depicts a board interconnect system 10 in accordance to one embodiment of the present invention. The system 10 includes an electrical device 12, an interposer 14, a PCB 16, and a substrate 20. The electrical device 12 includes a first conductive arrangement 13. The first conductive arrangement 13 may include discretely positioned pads and solder bumps positioned thereon for establishing an electrical connection with the substrate 20. The electrical device 12 is a die (or silicon). It is recognized that the electrical device 12 may be implemented as, but not limited to, an integrated circuit, an application-specific integrated circuit (ASIC) or other generally recognized suitable surface mount device (SMD) based electrical component. The PCB 16 generally comprises a second conductive arrangement 15 that may be in the form of discretely positioned conductive pads or solder balls/columns.

The substrate 20 includes a top side 24 and a bottom side 26. The electrical device 12 and the substrate 20 form a package. The substrate 20 includes a first conductive interface 17 (including discretely positioned pads or other suitable electrical contacts positioned at the top side 24), copper tracks (not shown) positioned therein, and a second conductive interface 19 (including pads, solder balls/columns or other suitable electrical contacts) positioned at the bottom side 26. The first conductive interface 17 of the package includes one or more discretely positioned electrical contacts for selectively contacting one or more contacts in the first conductive arrangement 13 of the electrical device 12.

The interposer 14 includes a frame 18, and a plurality of interconnects 22a-22n (or generally shown as 22). The substrate 20 is generally configured to, among other things, distribute the electrical signals from the electrical device 12 to a wider pitch on the interposer 14. The interposer 14 provides a one to one pitch ratio between the substrate 20 and the PCB 16. The interposer 14 is generally configured to provide removable conductivity between the electrical device 12 and the board 16. Each interconnect 22a-22n is generally made up of a discrete bundle of carbon nanotubes (CNTs). The CNTs may be highly conductive and may offer low electrical resistance. The CNTs will be discussed in more detail in connection with FIG. 2.

The second conductive interface 19 of the substrate 20 includes one or more discretely positioned electrical contacts for selectively contacting one or more of the interconnects 22a-22n. For example, the CNTs of the interconnects 22a-22n are generally configured to bite into or pierce into the electrical contacts of the second conductive interface 19.

In general, the first conductive interface 17 of the substrate 20 conducts electrical signals from the electrical device 12 through to the copper tracks in the substrate 20, whereby the copper tracks deliver such signals to the second conductive interface 19 through to one or more of the plurality of interconnects 22a-22n. The one or more of the plurality of interconnects 22a-22n contact the second conductive arrangement 15 of the PCB 16 to deliver the electrical signals to the PCB 16. The CNTs of the interconnects 22a-22n are configured to bite (or pierce) into the electrical contacts of the second conductive arrangement 15 of the PCB 16 to establish contact.

The frame 18 is non-conductive and includes a base portion 27 and walls 28. The plurality of interconnects 22a-22n are embedded into the base portion 27 and separate from each other. The walls extend in a perpendicular manner with respect to the PCB 16 and surround the base portion 27 and the plurality of interconnects 22a-22n. The walls 28 may be tapered at a top end thereof to receive the package 20. The frame 18 includes indexing posts 30a-30n. Receiving holes in the PCB 16 may receive such posts 30a-30n so that the interposer 14 is aligned over the corresponding conductive interface of the PCB 16. The CNTs of the interconnects 22a-22n may enable a lower compressive force than land grid array (LGA) sockets when such a force is applied to the interposer 14. For example, the CNTs may not require a high compression force for establishing a compliant electrical contact between the contacts of the second conductive interface 19 of the package 20 and the contacts of the second conductive arrangement 15 of the PCB 16.

Figure 2:
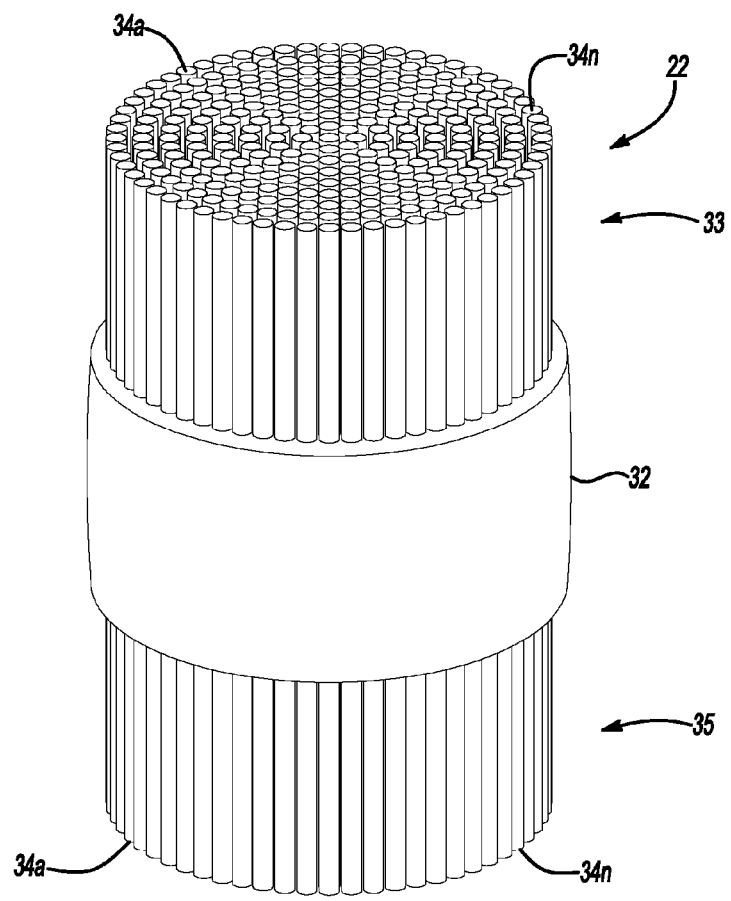
FIG. 2 depicts a detailed view of an interconnect from an interposer of FIG. 1.

FIG. 2 depicts a detailed view of the interconnect 22 from the interposer 14 of FIG. 1. Each interconnect 22 includes a conductive copper slug 32 and a plurality of CNTs 34a-34n.

In general, the CNTs 34a-34n are fairly uniform in diameter and spacing. In terms of height, a 10% variation may be exhibited between the CNTs 34a-34n. Such a variation may enable a soft initial coupling. The CNTs 34a-34n extend through the copper slug 32. At a first end 33, the CNTs 34a-34n are configured to pierce or bite into corresponding contacts in the second conductive interface 19 of the package 20. At a second end 35, the CNTs 34a-34n are configured to pierce or bite into contacts in the second conductive arrangement of the PCB 16. The CNTs 34a-34n may provide for high thermal conductivity and may be mechanically compliant. For example, the CNTs 34a-34n may expand, flex, or contract without being damaged under external force or in response to temperature variation. The implementation of CNTs 34a-34n within the interposer 14 may enable looser geometric tolerances (e.g., height variations, flatness differences, thermal expansion mismatches). For example, with respect to the height variations, it may not be necessary for the substrate 20 to have to be completely parallel to the board 16 to ensure conduction between the electrical device 12 and the PCB 16. The substrate 20 may be placed on a slope with respect to the PCB 16. The implementation of the CNTs 34a-34n may also enable for larger interconnect packages (e.g., electrical devices 12 and substrates 14) for larger size thresholds. For example, the CNTs 34a-34n may enable the substrate 20 to be packaged in larger sizes potentially offsetting temperature mismatch issues between the PCB 16 and the package. In addition, the CNTs 34a-34n may also provide for a smaller and less expensive interconnect substrates and may also reduce the compression force needed to achieve electrical contact between the electrical device 12 and the PCB 16.

It is generally contemplated that the first conductive interface 17 may also include CNTs that are grown on the top side 24 (i.e., in addition to pads, solder columns or solder balls) of the package 20 to establish electrical communication with the electrical device 12. It is also generally contemplated that the second conductive interface 19 may also include CNTs that are grown on the bottom side 26 of the (i.e., in addition to pads, solder columns or solder balls) of the package 20 to establish electrical communication with the PCB 16.

Figure 3:
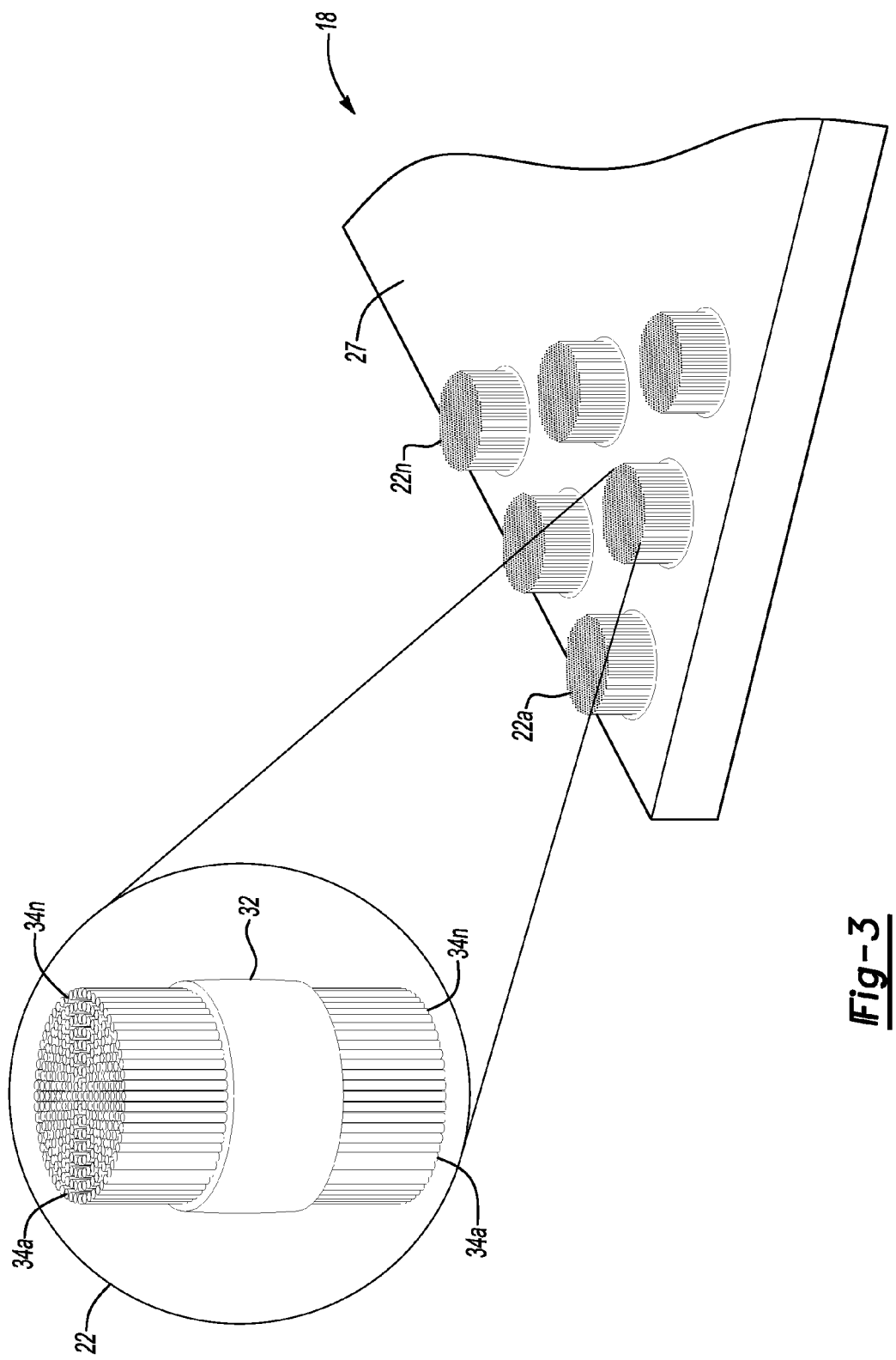
FIG. 3 depicts a detailed view of the plurality of interconnects embedded within a base portion.

FIG. 3 depicts a detailed view of the plurality of interconnects 22a-22n as embedded in the in the base portion 27 of the frame 18. The copper slug 32 for each interconnect 22a-22n is embedded into the base portion 27. The base portion 27 is non-conductive. As shown, each interconnect 22a-22n is discretely positioned so that contact is not made with neighboring interconnects 22a-22n to enable discrete or separate electrical conduction for the contacts of the electrical device 12 and corresponding contacts on the PCB 16. The placement of the CNTs 34a-34n within the cooper slug 32 which forms the interconnect 22 and the placement of such interconnects 22 within the base portion 27 may obviate the need to grow CNTs directly on the substrate 20 and/or on the PCB 16 as such a condition may be expensive or not entirely feasible.

While FIGS. 2-3 illustrate that the slug 32 and the CNTs 34a-34n generally form a cylindrical shape, it is contemplated that the slug 32 and the CNTs 34a-34n may be formed into a generally triangular shape, a rectangular shape, or other suitable shape. The overall shape formed by the slug 32 and the CNTs 34a-34n may vary based on the desired criteria of a particular implementation. In addition, while FIG. 3 illustrates that the interconnects 22a-22n are arranged in rows within the base portion 27, it is contemplated that the interconnects 22a-22n may be arranged in a checkerboard pattern or other suitable pattern within the base portion 27. The arrangement of the interconnects 22a-22n within the base portion 27 may vary based on the desired criteria of a particular implementation.

Figure 4:
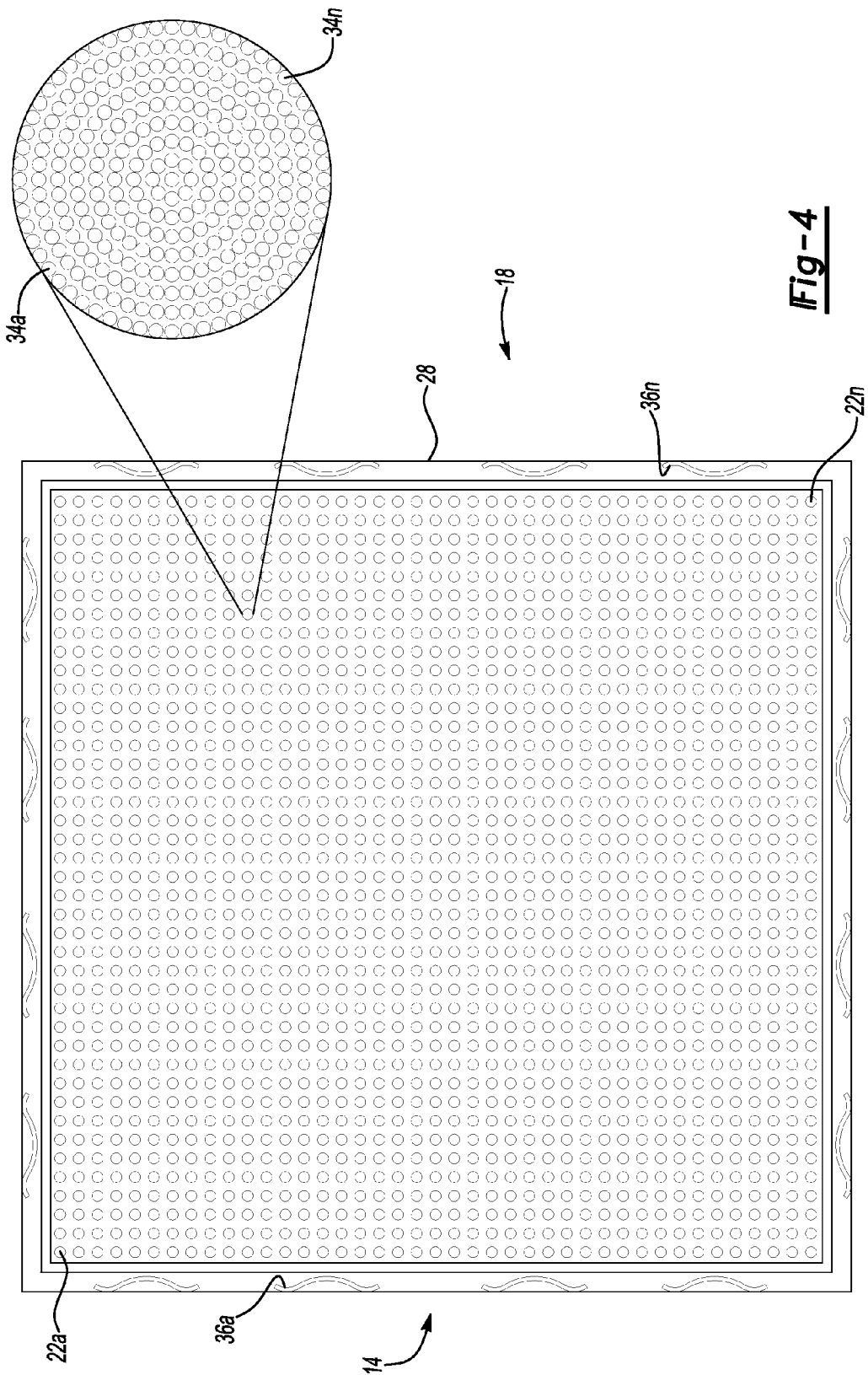
FIG. 4 depicts a top view of the interposer in accordance to one embodiment of the present invention.

FIG. 4 depicts a top view of the interposer 14 in accordance to one embodiment of the present invention. The interposer 14 includes at least one C-shaped spring 36a-36n embedded within the walls 28 of the frame 18. The C-shaped springs 36a-36n are generally configured to deflect towards interior sections of the frame 18 responsive to contact from one or more sides of the package (e.g., the electrical device 12 and the substrate 20). The C-shaped springs 36a-36n horizontally align the package within the interposer 14.

While FIG. 4 illustrates a plurality of C-shaped springs 36a-36n disposed around an interior perimeter of the frame 18, it is contemplated that a single C-shaped spring 36 may be embedded into a single interior side of the frame 18 to retain the package. The particular number of C-shaped springs 36 implemented in the frame 18 may vary based on the length and width of the package 20. As noted above, the CNTs 34a-34n of the one or more of the plurality of interconnects 22a-22n are generally configured to engage the contacts within the second conductive interface 19 (e.g., at the bottom side of the package) of the package 20.

FIG. 5 depicts a bottom view of the interposer 14 in accordance to one embodiment of the present invention. The indexing posts 30a-30n are generally received by receiving holes in the PCB 16 so that the one or more of the interconnects 22a-22n are discretely positioned over corresponding contacts within the second conductive arrangement 15 of the PCB 16 to enable electrical communication therethrough. While a plurality of indexing posts 30a-30n are illustrated, it is contemplated that any number of posts 30a-30n may be implemented with the frame 18 for aligning the interposer 14 accordingly with the PCB 16.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. An interposer for a board interconnect system, the interposer comprising:
   a frame for receiving a substrate, the substrate including a top side, a bottom side, and a conductive interface extending through the top side and the bottom side for delivering an electrical signal from an electrical device positioned on the top side therethrough; and
   at least one interconnect including a plurality of carbon nanotubes (CNTs) positioned within the frame for contacting the conductive interface of the substrate to deliver the electrical signal to a conductive arrangement of a circuit board.

2. The interposer of claim 1 wherein the plurality of CNTs contact the conductive interface at the bottom side of the substrate.

3. The interposer of claim 1 wherein the at least one interconnect further includes a copper slug embedded within the frame for supporting the plurality of CNTs on a top end of the slug and for supporting the plurality of CNTs on a bottom end of the slug.

4. The interposer of claim 3 wherein the plurality of CNTs extend away from the top end of the slug to contact the conductive interface of the substrate and the plurality of CNTs extend away from the bottom end of the slug to contact the conductive arrangement of the circuit board.

5. The interposer of claim 4 wherein the plurality of CNTs extend away from the top end of the slug to contact the conductive interface at the bottom side of the substrate.

6. A board interconnect system comprising:
   an electrical device for transmitting an electrical signal;
   a circuit board for receiving the electrical signal;
   a substrate including a top side, a bottom side, and a conductive interface extending through the top side and the bottom side for delivering the electrical signal from the electrical device to the circuit board; and
   an interposer including:
      a frame for receiving the substrate; and
      at least one interconnect including a plurality of carbon nanotubes (CNTs) positioned within the frame for contacting the conductive interface of the substrate to deliver the electrical signal to a conductive arrangement of the circuit board.

7. The system of claim 6 wherein the plurality of CNTs contact the conductive interface at the bottom side of the substrate.

8. The system of claim 6 wherein the at least one interconnect further includes a copper slug embedded within the frame for supporting the plurality of CNTs on a top end thereof and for supporting the plurality of CNTs on a bottom end thereof.

9. The system of claim 8 wherein the plurality of CNTs extend away from the top end of the slug to contact the conductive interface of the substrate and the plurality of CNTs extend away from the bottom end of the slug to contact the conductive arrangement of the circuit board.

10. The system of claim 9 wherein the plurality of CNTs extend away from the top end of the slug to contact the conductive interface at the bottom side of the substrate.

11. A board interconnect system comprising:
    an electrical device for transmitting an electrical signal;
    a circuit board including a conductive arrangement for receiving the electrical signal;
    a substrate including a top side, a bottom side, and a conductive interface extending through the top side and the bottom side for delivering the electrical signal from the electrical device positioned on the top side therethrough; and
    an interposer including:
       a frame for receiving the substrate; and
       at least one interconnect having a plurality of carbon nanotubes (CNTs) in electrical communication with the conductive interface of the substrate to provide the electrical signal to the conductive arrangement of the circuit board.

12. The system of claim 11 wherein the plurality of CNTs contact the conductive interface at the bottom side of the substrate.

13. The system of claim 11 wherein the at least one interconnect further includes a copper slug embedded within the frame for supporting the plurality of CNTs on a top end thereof and for supporting the plurality of CNTs on a bottom end thereof.

14. The system of claim 13 wherein the plurality of CNTs extend away from the top end of the slug to contact the conductive interface of the substrate and the plurality of CNTs extend away from the bottom end of the slug to contact the conductive arrangement of the circuit board.

15. The system of claim 14 wherein the plurality of CNTs extend away from the top end of the slug to contact the conductive interface at the bottom side of the substrate.

16. The system of claim 11 wherein the frame includes the plurality of CNTs being positioned therein.

* * * * *